(12) United States Patent
Wei et al.

(10) Patent No.: US 10,553,534 B2
(45) Date of Patent: Feb. 4, 2020

(54) METHOD FOR FABRICATING CONTACT ELECTRICAL FUSE

(71) Applicant: UNITED MICROELECTRONICS CORP., Hsin-Chu (TW)

(72) Inventors: Ming-Te Wei, Changhua County (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/949,084

(22) Filed: Apr. 10, 2018

(65) Prior Publication Data

US 2018/0233449 A1 Aug. 16, 2018

Related U.S. Application Data

(62) Division of application No. 15/232,820, filed on Aug. 10, 2016, now Pat. No. 9,972,570.

(30) Foreign Application Priority Data

Jul. 14, 2016 (CN) .......................... 2016 1 0555077

(51) Int. Cl.
| | |
|---|---|
| *H01L 23/525* | (2006.01) |
| *H01L 23/532* | (2006.01) |
| *H01L 21/768* | (2006.01) |
| *H01L 21/033* | (2006.01) |
| *H01L 21/311* | (2006.01) |
| *H01L 21/8234* | (2006.01) |
| *H01L 23/522* | (2006.01) |

(52) U.S. Cl.
CPC ...... *H01L 23/5256* (2013.01); *H01L 21/0332* (2013.01); *H01L 21/31116* (2013.01); *H01L 21/31122* (2013.01); *H01L 21/31138* (2013.01); *H01L 21/7681* (2013.01); *H01L 21/76804* (2013.01); *H01L 21/76811* (2013.01); *H01L 21/823475* (2013.01); *H01L 23/5226* (2013.01); *H01L 23/53295* (2013.01)

(58) Field of Classification Search
CPC ........... H01L 21/0332; H01L 21/31116; H01L 21/31122; H01L 21/31138; H01L 21/7681; H01L 21/76811; H01L 21/823475; H01L 23/5256; H01L 23/5226
See application file for complete search history.

(56) References Cited

U.S. PATENT DOCUMENTS

| | | | |
|---|---|---|---|
| 6,295,721 B1 | 10/2001 | Tsai | |
| 9,064,871 B2 | 6/2015 | Bao et al. | |
| 9,305,886 B2 | 4/2016 | Shao | |
| 2008/0179708 A1 | 7/2008 | Ogawa | |
| 2010/0164121 A1 | 7/2010 | Feustel | |

(Continued)

*Primary Examiner* — Mark W Tornow
(74) *Attorney, Agent, or Firm* — Winston Hsu

(57) ABSTRACT

A method for fabricating semiconductor device includes the steps of first forming a first dielectric layer on a substrate, in which a first conductor is embedded within the first dielectric layer. Next, a second dielectric layer is formed on the first dielectric layer, part of the second dielectric layer is removed to form a contact hole, and a lateral etching process is conducted to expand the contact hole to form a funnel-shaped opening. Next, a metal layer is formed in the funnel-shaped opening, and the metal layer is planarized to form a second conductor.

8 Claims, 10 Drawing Sheets

(56) References Cited

U.S. PATENT DOCUMENTS

| | | | |
|---|---|---|---|
| 2010/0197133 A1* | 8/2010 | Werner | H01L 21/0337 |
| | | | 438/637 |
| 2011/0292752 A1 | 12/2011 | Arai | |
| 2013/0130507 A1* | 5/2013 | Wang | H01L 21/31116 |
| | | | 438/724 |
| 2015/0325520 A1* | 11/2015 | Yu | H01L 23/5384 |
| | | | 257/774 |
| 2016/0049330 A1 | 2/2016 | Peng | |

* cited by examiner

METHOD FOR FABRICATING CONTACT ELECTRICAL FUSE

CROSS REFERENCE TO RELATED APPLICATIONS

This application is a division of U.S. application Ser. No. 15/232,820 filed Aug. 10, 2016, and incorporated herein by reference in its entirety.

BACKGROUND OF THE INVENTION

1. Field of the Invention

The invention relates to a method for fabricating semiconductor device, and more particularly to a method for fabricating contact electric fuse.

2. Description of the Prior Art

As semiconductor processes become smaller and more complex, semiconductor components are influenced by impurities more easily. If a single metal link, a diode, or a MOS is broken down, the whole chip will be unusable. To treat this problem, fuses can be selectively blown for increasing the yield of IC manufacturing.

In general, fused circuits are redundant circuits of an IC. When defects are found in the circuit, fuses can be selectively blown for repairing or replacing defective circuits. In addition, fuses provide the function of programming circuits for various customized functions. Fuses are classified into two categories based on their operation: thermal fuse and electrical fuse. Thermal fuses can be cut by lasers and be linked by laser repair. An electrical fuse utilizes electromigration for both forming open circuits and for repairing. The electrical fuse for semiconductor devices may be classified into categories of poly electrical fuse, MOS capacitor anti-fuse, diffusion fuse, contact electrical fuse, contact anti-fuse, and the like.

Currently, metal wires or contact plugs serving as electric fuses are typically fabricated by dual damascene processes. However, conductive wires formed through this approach often results in voids formed within the wires thereby degrading the performance of the fuse. Hence, how to resolve this issue has become an important task in this field.

SUMMARY OF THE INVENTION

According to a preferred embodiment of the present invention, a method for fabricating semiconductor device is disclosed. First, a substrate is provided, and a first dielectric layer is formed on the substrate, in which a first conductor is embedded within the first dielectric layer. Next, a second dielectric layer is formed on the first dielectric layer, part of the second dielectric layer is removed to form a contact hole, and a lateral etching process is conducted to expand the contact hole to form a funnel-shaped opening. Next, a metal layer is formed in the funnel-shaped opening, and the metal layer is planarized to form a second conductor.

According to another aspect of the present invention, a semiconductor device includes: a substrate; a first dielectric layer on the substrate; and a first conductor in the first dielectric layer, in which the first conductor is funnel-shaped.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
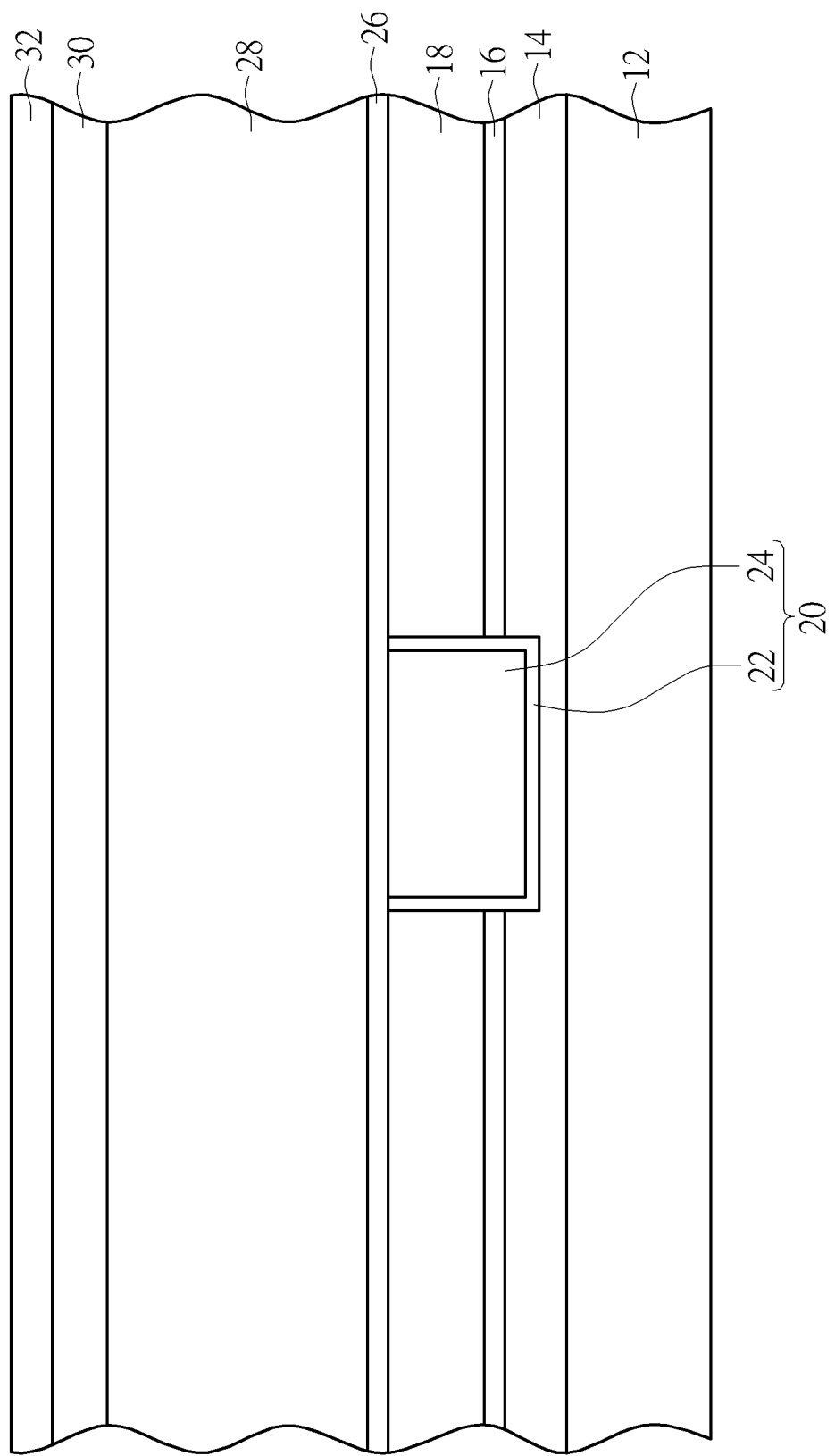
FIGS. 1-5 illustrate a method for fabricating contact electric fuse according to a preferred embodiment of the present invention.

Referring to FIGS. 1-5, FIGS. 1-5 illustrate a method for fabricating contact plug or conductive wire used as an electric fuse according to a preferred embodiment of the present invention. As shown in FIG. 1, a substrate 12 is provided, in which the substrate 12 could be a semiconductor substrate such as a silicon substrate, an epitaxial substrate, a SiC substrate, or a silicon-on-insulator (SOI) substrate, but not limited thereto. At least an active device such as a metal-oxide semiconductor (MOS) transistor could be formed on the substrate, in which the MOS transistor could include typical transistor elements such as gate structure, spacer, source/drain region, silicides, and epitaxial layers. Next, an interlayer dielectric (ILD) layer 14 is formed on the substrate 12 to cover the MOS transistor.

Next, a dielectric layer 16 and a dielectric layer 18 are formed on the substrate 12, and a conductor 20 is embedded in the dielectric layer 18, dielectric layer 16, and ILD layer 14, in which the top surfaces of the conductor 20 and dielectric layer 18 are coplanar. The bottom surface of the conductor 20 could be connected to a doped region or gate structure on the substrate 12 through other conductors (not shown), in which the doped region or gate structure could be a source/drain region or gate structure of the aforementioned MOS transistor. In this embodiment, the dielectric layer 16 is preferably an organic dielectric coating (ODC) and the dielectric layer 18 is preferably an ultra low-k (ULK) dielectric layer, in which the thickness of the dielectric layer 18 is preferably between 650 Angstroms to 850 Angstroms or most preferably at around 750 Angstroms. The conductor 20 could be a trench conductor or a via conductor and the conductor 20 could further include a barrier layer 22 and a metal layer 24, in which the barrier layer 22 could be selected from the group consisting of Ti, TiN, Ta, and TaN and the metal layer 24 could be selected from the group consisting W, Cu, Al, TiAl, and CoWP, but not limited thereto.

Next, a stop layer 26, a dielectric layer 28, a dielectric layer 30, and a first mask layer 32 are formed on the dielectric layer 18 to cover the conductor 20 completely. In this embodiment, the stop layer 26 is made of SiCN, the dielectric layer 28 is made of a ULK dielectric layer, the dielectric layer 30 is made of SiON, and the first mask layer 32 could be selected from the group consisting of Ti and TiN. It should be noted that even though the first mask layer 32 pertains to a single-layered structure in this embodiment, the first mask layer 32 could also be made of multiple layers according to an embodiment of the present invention. For instance, the first mask layer 32 could also include a mask layer made of Ti and another mask layer made of TiN, which is also within the scope of the present invention.

Figure 2:
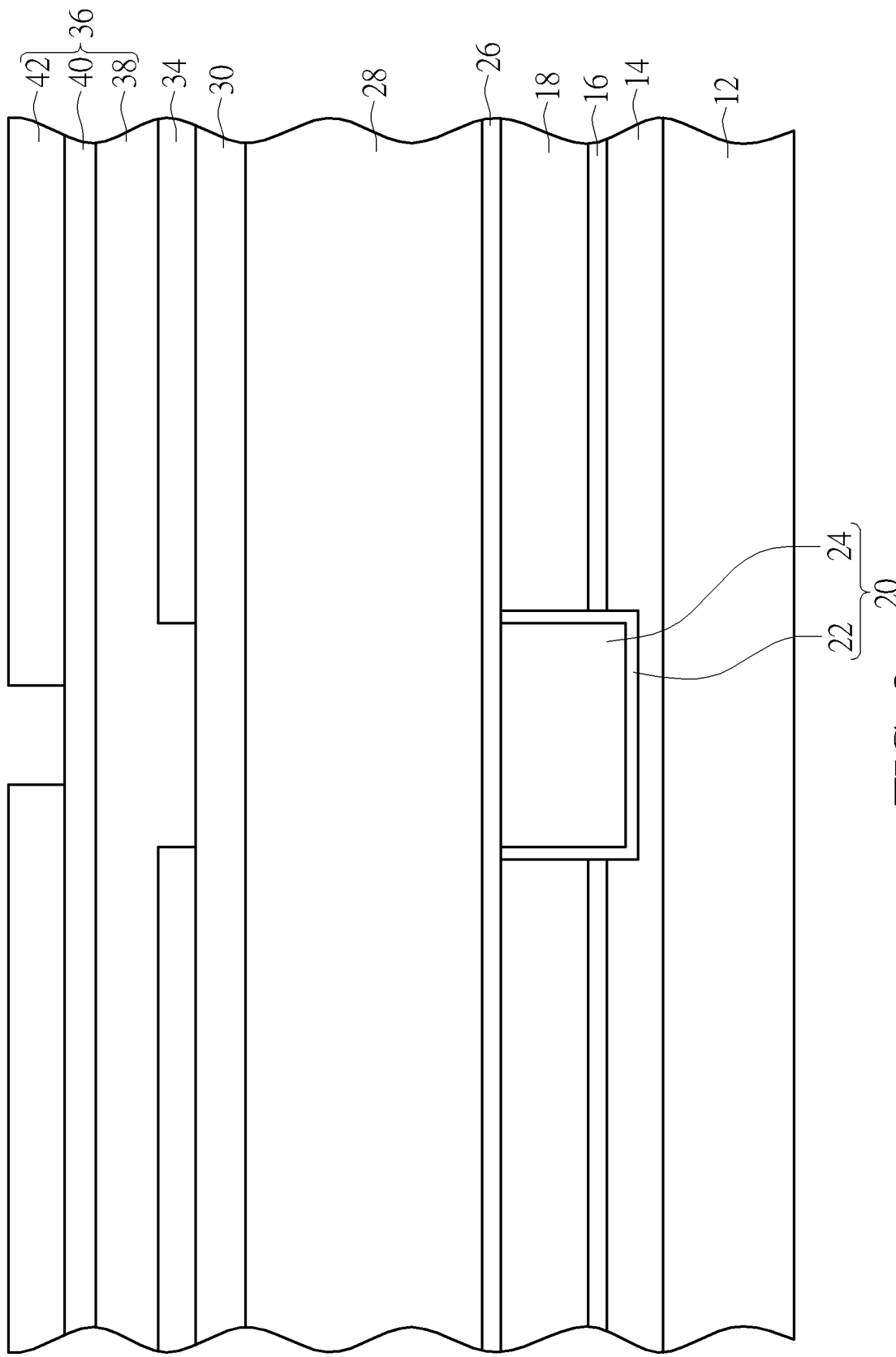

Next, as shown in FIG. 2, an etching process is conducted by using a chlorine-containing gas to remove part of the first mask layer 32 for forming an opening (not shown). The opening exposes part of the dielectric layer 30 surface and forms a patterned first mask layer 34. Next, a second mask layer 36 is formed on the patterned first mask layer 34 and fill the opening entirely. Preferably, the second mask layer 36 includes an organic dielectric layer (ODL) 38, a silicon-containing hard mask bottom anti-reflective coating (SHB) layer 40 and a patterned resist 42.

Figure 3:
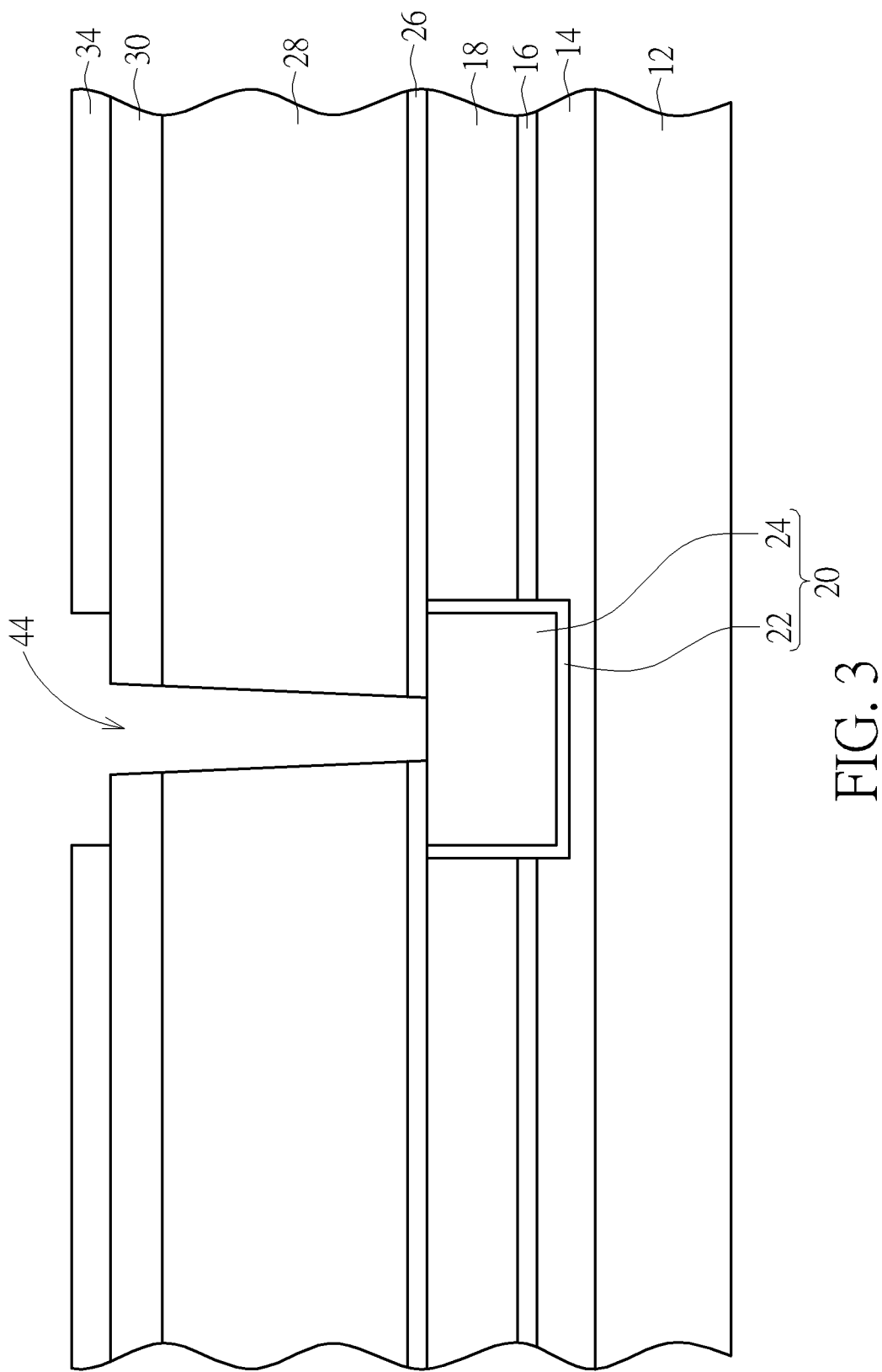

Next, as shown in FIG. 3, an etching process is conducted by using the patterned resist 42 as mask and using a fluorine-containing gas to remove part of the SHB layer 40, part of the ODL 38, part of the dielectric layer 30, part of the dielectric layer 28, and part of the stop layer 26 to form a via hole 44 exposing part of the conductor 20 surface. The patterned resist 42, SHB layer 40, and ODL 38 are then removed to expose the patterned first mask layer 34.

Figure 4:
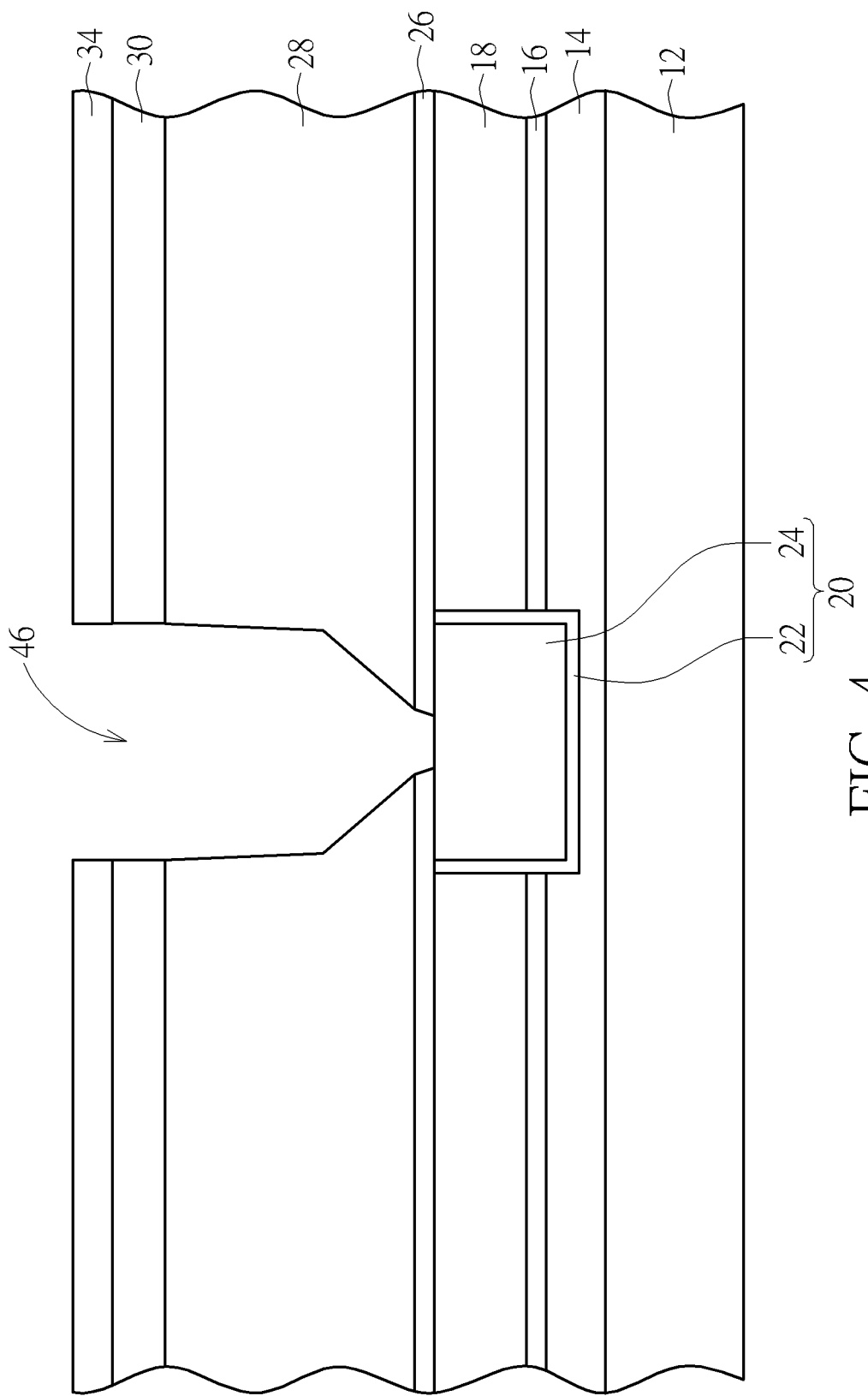

Next, as shown in FIG. 4, a lateral etching process is conducted by using the first mask layer 34 as mask to expand the via hole 44 into a funnel-shaped opening 46. It should be noted that the lateral etching process conducted in this embodiment to expand or enlarge the via hole 44 is preferably accomplished by two approaches, in which one of the approaches include using an etching gas containing nitrogen and/or helium to conduct the aforementioned lateral etching process.

In addition to using the aforementioned etching gas to perform the lateral etching process, it would be desirable to adjust the etching bias of the etching process by adjusting radio frequency (RF) power to control the size and degree of angles of the funnel-shaped opening being formed. In this embodiment, the RF power is preferably adjusted between 1000 W to 2000 W, but not limited thereto. Overall, by using the aforementioned etching gas to perform the lateral etching process and/or adjusting the RF power within the desirable range, it would be desirable to expand the planar and slightly inclined sidewalls of the via hole in an uneven or non-uniform manner for forming the funnel-shaped opening shown in FIG. 4.

Figure 5:
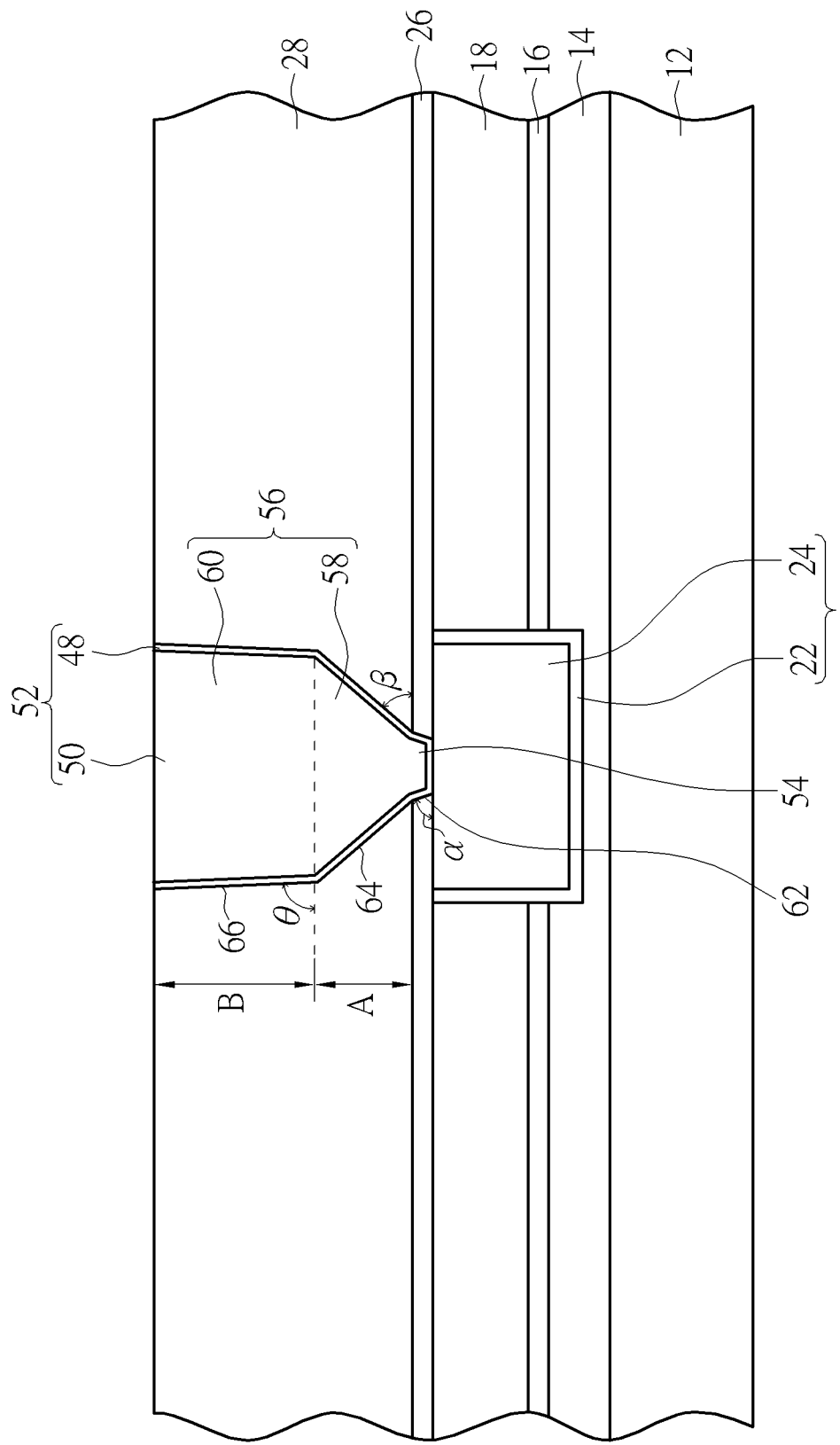

Next, as shown in FIG. 5, a barrier layer 48 and a metal layer 50 are formed to fill the funnel-shaped opening 46 completely, and a planarizing process such as chemical mechanical polishing (CMP) process is conducted to remove part of the metal layer 50, part of the barrier layer 48, the patterned first mask layer 32, and the dielectric layer 30 for forming a contact plug or conductor 52 in the dielectric layer 28 and stop layer 26. Preferably, the barrier layer 48 could be selected from the group consisting of Ti, TiN, Ta, and TaN and the metal layer 50 could be selected from the group consisting of W, Cu, Al, TiAl, and CoWP. This completes the fabrication of a contact plug electric fuse according to a preferred embodiment of the present invention.

Referring again to FIG. 5, which further illustrates a structural view of a contact electric fuse according to a preferred embodiment of the present invention. As shown in FIG. 5, the contact electric fuse includes a conductor 52 embedded within the dielectric layer 28 and stop layer 26 and another conductor 20 embedded in the dielectric layer 18, stop layer 16, and ILD layer 14. Viewing from a more detailed perspective, the conductor 52 preferably includes a first portion 54 and a second portion 56, in which the first portion 54 is embedded in the stop layer 26, the second portion 56 is embedded in the dielectric layer 28, and the second portion 56 further includes a portion 58 and a portion 60. In this embodiment, a distance A measured from the top surface of the portion 58 to the top surface of the stop layer 26 is preferably between 750 Angstroms to 850 Angstroms or most preferably at 800 Angstroms, and a distance B measured from the bottom surface of the portion 60 to the top surface of the dielectric layer 28 is preferably between 950 Angstroms to 1050 Angstroms or most preferably at around 1000 Angstroms.

Specifically, the first portion 54 embedded within the stop layer 26 includes a first slope 62, the second portion 56 embedded within the dielectric layer 28 includes a second slope 64 and a third slope 66. In this embodiment, the first slope 62 and the second slope 64 are different, and the second slope 64 and the third slope 66 are different, or all of the first slope 62, second slope 64, and third slope 66 are different. In this embodiment, an angle included by the first slope 62 and an imaginary horizontal line is preferably between 80 degrees to 90 degrees or most preferably 80 degrees, an angle included by the second slope 64 and an imaginary horizontal line is preferably between 30 degrees to 50 degrees and most preferably 40 degrees, and an angle included by the third slope 66 and an imaginary horizontal line is preferably between 85 degrees to 90 degrees or most preferably 85 degrees.

Figure 6:
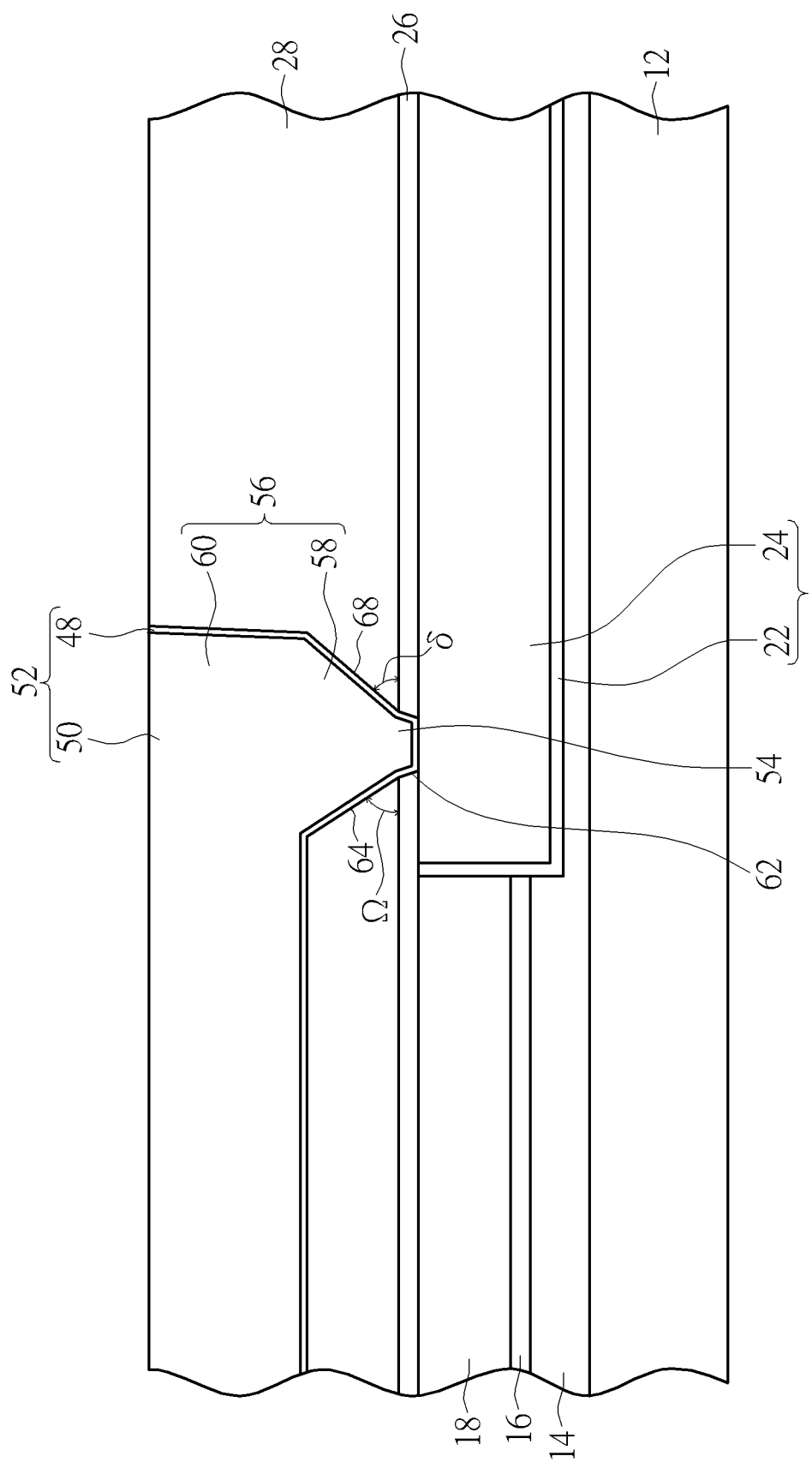
FIG. 6 illustrates a structural view of a contact electric fuse viewing from a different angle according to a preferred embodiment of the present invention.

Referring to FIG. 6, FIG. 6 illustrates a structural view of the contact electric fuse viewing from a different angle according to a preferred embodiment of the present invention. In contrast to the second slopes 64 on both left and right sidewalls of the second portion 56 shown in FIG. 5 being symmetrical, the second slope 64 on left sidewall of the second portion 56 and the second slope 68 on right sidewall of the second portion 56 shown in FIG. 6 are nonsymmetrical. More specifically, an angle included by the second slope 68 relative to the end portion of the entire electric fuse and an imaginary horizontal line is slightly less than an angle included by the second slope 64 and an imaginary horizontal line. For instance, an angle included by the second slope 68 and an imaginary horizontal line is preferably between 30 degrees to 50 degrees or most preferably 40 degrees, and an angle included by the second slope 64 and an imaginary horizontal line is preferably between 40 degrees to 60 degrees or most preferably 50 degrees.

Figure 7:
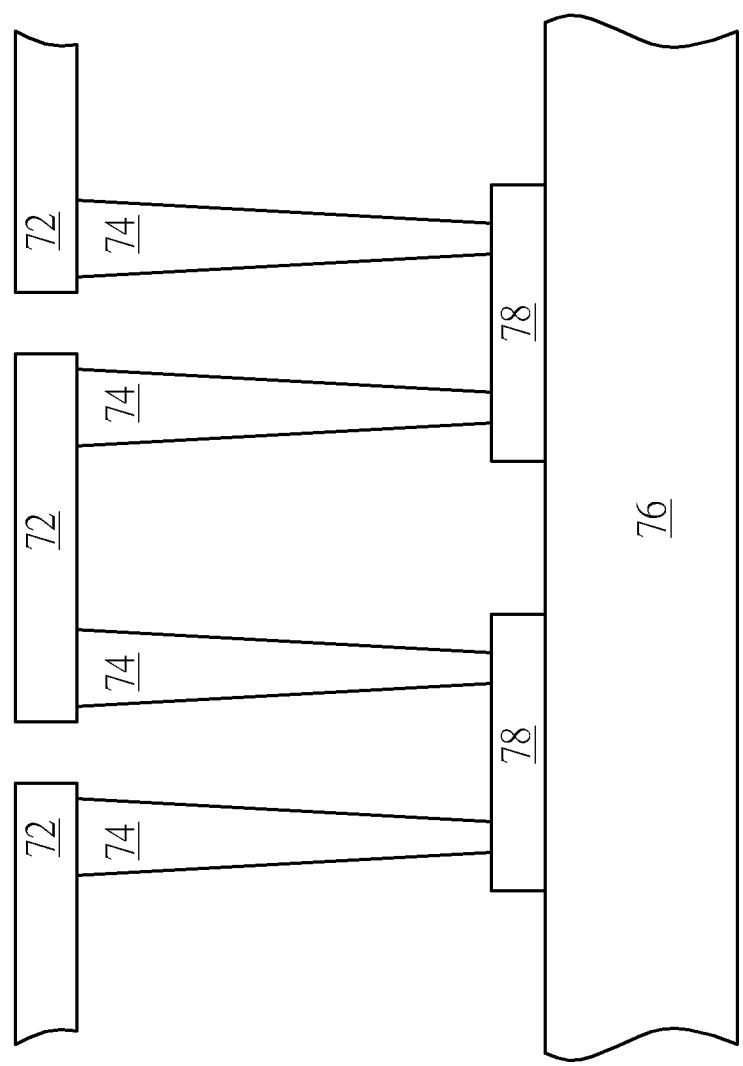
FIG. 7 illustrates a schematic view of a contact electric fuse according to an embodiment of the present invention.
Figure 8:
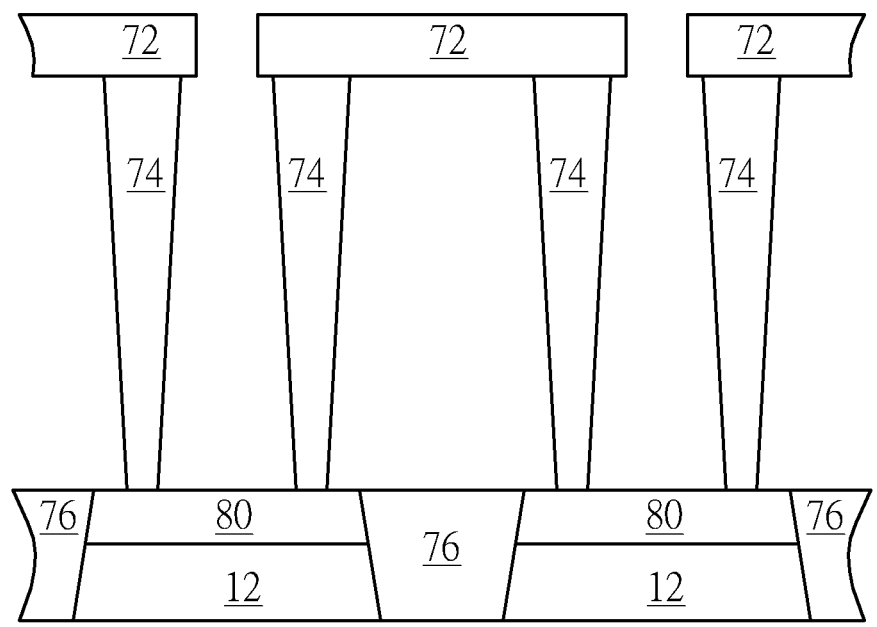
FIG. 8 illustrates a schematic view of a contact electric fuse according to an embodiment of the present invention.
Figure 9:
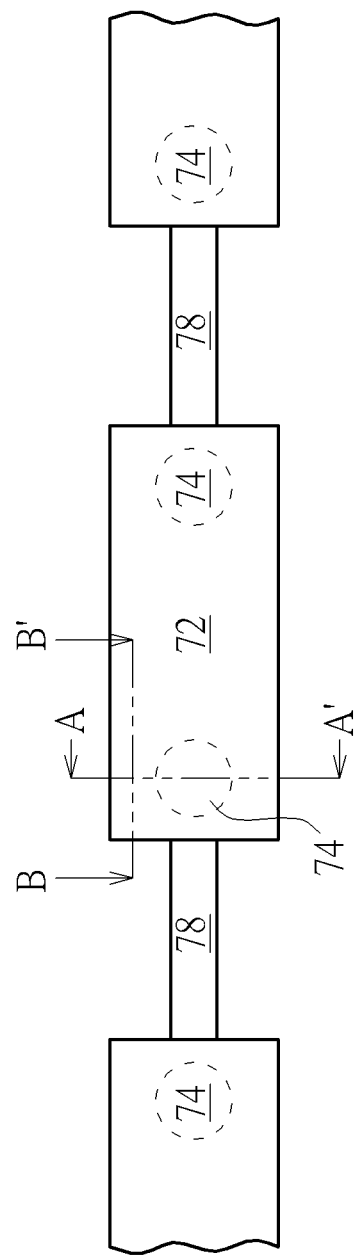
FIG. 9 illustrates a top view of the contact electric fuse shown in FIG. 7.

Referring to FIGS. 7-9, FIGS. 7-8 illustrate overall schematic views of the contact electric fuse according to different embodiments of the present invention and FIG. 9 illustrates a top view of the contact electric fuse shown in FIG. 7. Preferably, the structure disclosed in the aforementioned FIG. 5 is a cross-sectional view of FIG. 9 along the sectional line AA' whereas the structure disclosed in FIG. 6 is a cross-sectional view of FIG. 9 along the sectional line BB'.

As shown in FIG. 7-9, the contact electric fuse preferably includes trench conductors 72 and via conductors 74 disposed on the substrate 12 or shallow trench isolation 76, in which the trench conductors 72 being the portion 60 as disclosed in FIG. 5 or FIG. 6, and the via conductors 74 being the portion 58 connected to the portion 60. According to the embodiment shown in FIG. 7, the via conductors 74 could physically connect to polysilicon gates 78 disposed on the STI 76, such as to gate structures of different MOS transistors. According to the embodiment shown in FIG. 8, the via conductors 74 could physically connect to the doped regions 80 on the substrate 12, such as to source/drain regions of different MOS transistors. These two variations are all within the scope of the present invention.

Figure 10:
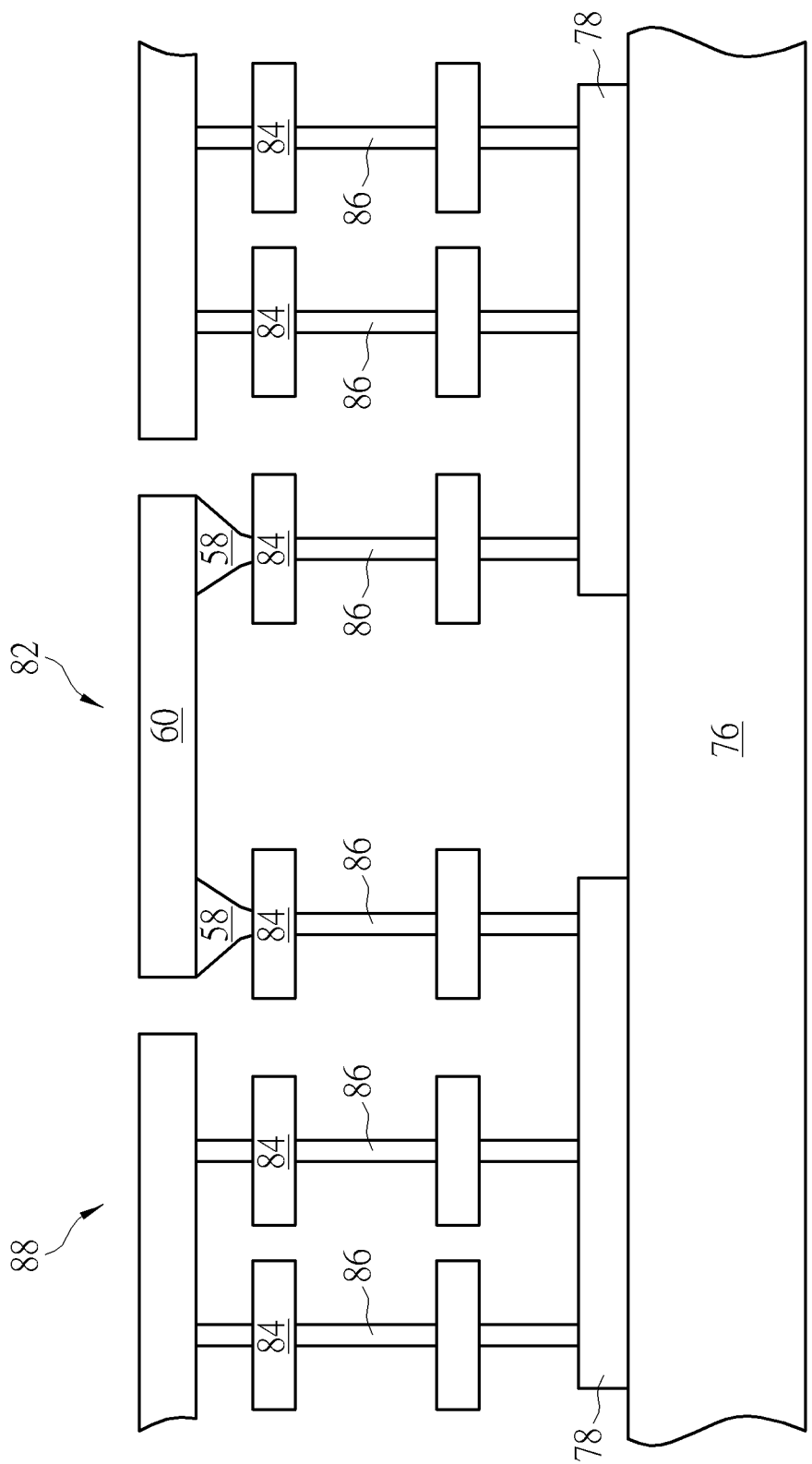
FIG. 10 illustrates a schematic view of a contact electric fuse according to an embodiment of the present invention.

Referring to FIG. 10, FIG. 10 illustrates a schematic view of a contact electric fuse according to an embodiment of the present invention. In contrast to having single via conductors connecting to the polysilicon gates 78 or doped regions 80 shown in FIGS. 7-8, the contact electric fuse 82 of this embodiment includes multiple layers of trench conductors and multiple layers of via conductors, in which the top trench conductor includes the portion 60 and portion 58 shown in FIG. 6 while the portion 58 is connected to the polysilicon gates 78 or doped regions through lower level trench conductors 84 and via conductors 86. In addition, it would be desirable to form metal interconnections 88 adjacent to two sides of the electric fuse 82 through typical dual damascene processes, in which the metal interconnections 88 preferably include trench conductors 84 and via conductors 86 not having funnel-shapes.

Overall, the present invention uses a novel etching gas content along with adjustment of RF power to form a funnel-shaped trench or via hole opening so that the conductor structure formed within the opening would also include a funnel-shape. Typically, via conductors or contact type electric fuses fabricated by dual damascene process often include voids and the presence of voids causes the fuses to break easily. By following the aforementioned process or approach to fabricate an electric fuse having funnel-shaped structure, the present invention is able to resolve the problems found in current contact type electric fuses and improve the quality of the fuses substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a second dielectric layer on the substrate;
   forming a first conductor in the second dielectric layer;
   forming a stop layer on the first conductor and the second dielectric layer;
   forming a first dielectric layer on the stop layer;
   forming a via hole in the first dielectric layer and the stop layer to expose the first conductor;
   performing a lateral etching process to expand the via hole for forming a funnel-shaped opening after exposing the first conductor, wherein an etching gas used to perform the lateral etching process comprises nitrogen and helium;
   forming a metal layer in the funnel-shaped opening; and
   planarizing the metal layer for forming a second conductor, wherein the second conductor comprises a first portion comprising a first sidewall, and a second portion in embedded in the first dielectric layer, wherein the second portion comprises a second sidewall and a third sidewall, each of the second sidewall and the third sidewall is planar, and wherein a first angle at an intersection of the first sidewall and a horizontal plane is between 80 degrees to 90 degrees, and wherein a second angle at the intersection of the second sidewall and a horizontal plane is between 30 degrees to 50 degrees, and wherein a third angle at the intersection of the third sidewall and a horizontal plane is between 85 degrees to 90 degrees.

2. The method of claim 1, wherein a top surface of the first conductor and a top surface of the second dielectric layer are coplanar.

3. The method of claim 1, further comprising:
   forming a first mask layer on the first dielectric layer;
   performing a first etching process to pattern the first mask layer for forming a patterned first mask layer;
   forming a second mask layer on the patterned first mask layer; and
   performing a second etching process to form the via hole in the second mask layer and the first dielectric layer.

4. The method of claim 3, further comprising using a chlorine-containing gas to perform the first etching process.

5. The method of claim 3, further comprising using a fluorine-containing gas to perform the second etching process.

6. The method of claim 1, wherein the second conductor is funnel-shaped.

7. The method of claim 6, wherein the second conductor comprises a first slope and a second slope, wherein the first slope is different from the second slope.

8. The method of claim 1, wherein a radio frequency (RF) power used during the lateral etching process is between 1000 W to 2000 W.

* * * * *